(12) United States Patent
Kim et al.

(10) Patent No.: US 10,693,498 B2
(45) Date of Patent: Jun. 23, 2020

(54) PARITY CHECK MATRIX GENERATOR, OPERATING METHOD THEREOF AND ERROR CORRECTION CIRCUIT USING PARITY CHECK MATRIX GENERATED BY THE SAME

(71) Applicant: SK hynix Inc., Gyeonggi-do (KR)

(72) Inventors: Dae Sung Kim, Gyeonggi-do (KR); Chol Su Chae, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 22 days.

(21) Appl. No.: 16/205,777

(22) Filed: Nov. 30, 2018

(65) Prior Publication Data

US 2019/0372592 A1 Dec. 5, 2019

(30) Foreign Application Priority Data

Jun. 4, 2018 (KR) .......................... 10-2018-0064319

(51) Int. Cl.
*H03M 13/11* (2006.01)
*G06F 11/10* (2006.01)

(52) U.S. Cl.
CPC ....... *H03M 13/116* (2013.01); *G06F 11/1076* (2013.01); *H03M 13/1171* (2013.01)

(58) Field of Classification Search
CPC ........... H03M 13/116; H03M 13/1128; H03M 13/036; H03M 13/1171
See application file for complete search history.

(56) References Cited

U.S. PATENT DOCUMENTS

| 8,145,971 | B2* | 3/2012 | Huang | ................. | H03M 13/116 |
| | | | | | 714/752 |
| 8,560,930 | B2* | 10/2013 | Li | ....................... | H03M 13/036 |
| | | | | | 714/777 |
| 2015/0381205 | A1* | 12/2015 | Zhang | ................. | H03M 13/116 |
| | | | | | 714/773 |
| 2018/0262211 | A1* | 9/2018 | Savin | ................. | H03M 13/1128 |

FOREIGN PATENT DOCUMENTS

KR 1020070107521 11/2007

* cited by examiner

*Primary Examiner* — Shelly A Chase
(74) *Attorney, Agent, or Firm* — IP & T Group LLP

(57) ABSTRACT

A parity check matrix generator for generating a parity check matrix including non-binary cyclic permutation matrices may include: a first memory configured to store a first weight as location information on a non-binary cyclic permutation matrix within the parity check matrix; a second memory configured to store a second weight as cyclic strength of matrix elements of the non-binary cyclic permutation matrix; a third memory configured to store a third weight used to determine a size of a non-binary matrix element among the matrix elements of the non-binary cyclic permutation matrix; and a matrix generator configured to generate the non-binary cyclic permutation matrix by applying a non-binary value to matrix elements of 1's among matrix elements of a binary cyclic permutation matrix having a size corresponding to the non-binary cyclic permutation matrix and reflecting one or more of the first to third weights into the non-binary value.

17 Claims, 5 Drawing Sheets

FIG.3

$$C_i = \begin{matrix} 1 & 0 & 0 \\ 0 & 1 & 0 \\ 0 & 0 & 1 \end{matrix} \quad k=0$$

$$C_{i1} = \begin{matrix} 0 & 1 & 0 \\ 0 & 0 & 1 \\ 1 & 0 & 0 \end{matrix} \quad k=1$$

$$C_{i2} = \begin{matrix} 0 & 0 & 1 \\ 1 & 0 & 0 \\ 0 & 1 & 0 \end{matrix} \quad k=2$$

FIG.4

$C1 = \begin{pmatrix} 0 & 1 & 0 \\ 0 & 0 & 1 \\ 1 & 0 & 0 \end{pmatrix}$ (i, j, k=1) → Converted

| Weight calculation rule | | Non-binary cyclic permutation matrix (C2) |
|---|---|---|
| Variable | Operation | |
| i | + | $C21 = \begin{pmatrix} 0 & a^i & 0 \\ 0 & 0 & a^i \\ a^i & 0 & 0 \end{pmatrix}$ |
| j | + | $C22 = \begin{pmatrix} 0 & a^j & 0 \\ 0 & 0 & a^j \\ a^j & 0 & 0 \end{pmatrix}$ |
| k | + | $C23 = \begin{pmatrix} 0 & a^k & 0 \\ 0 & 0 & a^k \\ a^k & 0 & 0 \end{pmatrix}$ |
| i, j | + | $C24 = \begin{pmatrix} 0 & a^{i+j} & 0 \\ 0 & 0 & a^{i+j} \\ a^{i+j} & 0 & 0 \end{pmatrix}$ |
| i, k | + | $C25 = \begin{pmatrix} 0 & a^{i+k} & 0 \\ 0 & 0 & a^{i+k} \\ a^{i+k} & 0 & 0 \end{pmatrix}$ |
| j, k | + | $C26 = \begin{pmatrix} 0 & a^{j+k} & 0 \\ 0 & 0 & a^{j+k} \\ a^{j+k} & 0 & 0 \end{pmatrix}$ |
| i, j, k | + | $C27 = \begin{pmatrix} 0 & a^{i+j+k} & 0 \\ 0 & 0 & a^{i+j+k} \\ a^{i+j+k} & 0 & 0 \end{pmatrix}$ |

$$C1 = \begin{matrix} 0 & 1 & 0 \\ 0 & 0 & 1 \\ 1 & 0 & 0 \end{matrix} \xrightarrow{\text{Converted}} C3 = \begin{matrix} 0 & a^{i+j} & 0 \\ 0 & 0 & a^{i+j+1} \\ a^{i+j+2} & 0 & 0 \end{matrix}$$

(i, j, k=1)

PARITY CHECK MATRIX GENERATOR, OPERATING METHOD THEREOF AND ERROR CORRECTION CIRCUIT USING PARITY CHECK MATRIX GENERATED BY THE SAME

CROSS-REFERENCES TO RELATED APPLICATION

The present application claims priority under 35 U.S.C. § 119(a) to Korean application number 10-2018-0064319, filed on Jun. 4, 2018, in the Korean Intellectual Property Office, which is incorporated herein by reference in its entirety.

BACKGROUND

1. Technical Field

Various embodiments of the present invention generally relate to a parity check matrix generator. Particularly, the embodiments relate to a device for generating a Quasi Cyclic Low Density Parity Check (QC-LDPC) code parity check matrix.

2. Related Art

A memory system may store data provided from an external device, and provide data stored therein to the external device according to a request of the external device. The memory system may include an error correction circuit to strengthen the reliability of data stored therein. The error correction circuit may perform an encoding operation by adding parity data to the data, and the memory system may store the encoded data. Furthermore, the error correction circuit may perform a decoding operation on data based on parity data, and the memory system may provide the data corrected through the decoding operation to the external device.

SUMMARY

Various embodiments are directed to a parity check matrix generating device for generating a QC-LDPC code parity check matrix which requires a small storage capacity while providing enhanced performance, an operating method thereof and an error correction circuit using a parity check matrix.

In an embodiment, a parity check matrix generator for generating a parity check matrix of a Quasi Cyclic Low Density Parity Check (QC-LDPC) code, the parity check matrix including non-binary cyclic permutation matrices, may include: a first memory configured to store a first weight as location information on a non-binary cyclic permutation matrix within the parity check matrix; a second memory configured to store a second weight as cyclic strength of matrix elements of the non-binary cyclic permutation matrix; a third memory configured to store a third weight used to determine a size of a non-binary matrix element among the matrix elements of the non-binary cyclic permutation matrix; and a matrix generator configured to generate the non-binary cyclic permutation matrix by applying a non-binary value to matrix elements of 1's among matrix elements of a binary cyclic permutation matrix having a size corresponding to the non-binary cyclic permutation matrix and reflecting one or more of the first to third weights into the non-binary value.

In an embodiment, there is provided an operating method of a parity check matrix generator for generating a parity check matrix of a Quasi Cyclic Low Density Parity Check (QC-LDPC) code. The operating method may include generating a non-binary parity check matrix including non-binary cyclic permutation matrices by converting binary cyclic permutation matrices included in a binary parity check matrix into the non-binary cyclic permutation matrices, respectively, wherein the converting of the binary cyclic permutation matrices into the non-binary cyclic permutation matrices comprises: calculating a weight corresponding to a binary cyclic permutation matrix based on matrix characteristics of the binary cyclic permutation matrix; and generating elements of a non-binary cyclic permutation matrix by applying the weight to a non-binary value.

In an embodiment, an error correction circuit may include: a parity check matrix generator configured to generate a parity check matrix of a Quasi Cyclic Low Density Parity Check (QC-LDPC); and a decoder configured to perform a decoding operation on a codeword based on the parity check matrix, wherein the parity check matrix generator: stores matrix characteristics of binary cyclic permutation matrices included in a binary parity check matrix of the QC-LDPC code, generates non-binary cyclic permutation matrices based on the matrix characteristics, and provides the parity check matrix including the non-binary cyclic permutation matrices to the decoder.

In an embodiment, parity check circuit may include: a parity check matrix generator configured to generate a non-binary parity check matrix of a Quasi Cyclic Low Density Parity Check (QC-LDPC) code through conversion of a binary parity check matrix of the QC-LDPC code based on intrinsic characteristics of the binary parity check matrix; and a parity checker configured to perform a parity check operation using the non-binary parity check matrix, wherein the parity check matrix generator performs the conversion by using one or more of selected arithmetic operations and one or more selected weights within the intrinsic characteristics.

BRIEF DESCRIPTION OF THE DRAWINGS

FIG. 3 is a diagram for describing the configurations of binary cyclic permutation matrices included in the binary parity check matrix.

FIG. 4 illustrates non-binary cyclic permutation matrices generated through various selection of the weights and arithmetic operations in accordance with the present embodiment.

DETAILED DESCRIPTION

The technical spirit of the present disclosure may be changed in various manners, and may be implemented as embodiments having various aspects. Hereinafter, the present disclosure will be described by way of some embodiments so that those skilled in the art can easily practice the embodiments of the present disclosure.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

The above-described exemplary embodiments are merely for the purpose of understanding the technical spirit of the present disclosure and the scope of the present disclosure should not be limited to the above-described exemplary embodiments. It will be obvious to those skilled in the art to which the present disclosure pertains that other modifications based on the technical spirit of the present disclosure may be made in addition to the above-described exemplary embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

Hereinafter, exemplary embodiments will be described in detail with reference to the accompanying drawings.

Figure 1:
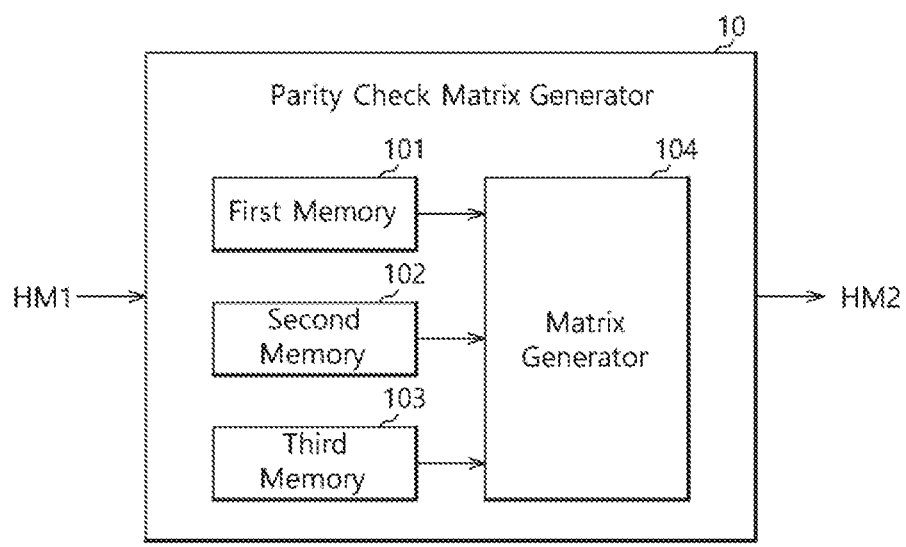
FIG. 1 is a block diagram illustrating a parity check matrix generator for generating a QC-LDPC code parity check matrix including non-binary cyclic permutation matrices in accordance with an embodiment.

FIG. 1 is a block diagram illustrating a parity check matrix generator 10 for generating a QC-LDPC code parity check matrix including non-binary cyclic permutation matrices in accordance with an embodiment.

Referring to FIG. 1, the parity check matrix generator 10 may generate a non-binary parity check matrix HM2 by converting a binary parity check matrix HM1. The non-binary parity check matrix HM2 may be used for an encoding operation and decoding operation using a QC-LDPC code. The encoding operation may include generating a codeword by encoding data based on the non-binary parity check matrix HM2. The decoding operation may include recovering original data by decoding the codeword through a parity check with the non-binary parity check matrix HM2.

The parity check matrix generator 10 may convert binary cyclic permutation matrices contained in the binary parity check matrix HM1 into non-binary cyclic permutation matrices contained in the non-binary parity check matrix HM2. The parity check matrix generator 10 may generate the non-binary parity check matrix HM2 by converting the binary parity check matrix HM1 such that the non-binary cyclic permutation matrices and the binary cyclic permutation matrices respectively corresponding to each other are disposed in the same location in the non-binary parity check matrix HM2 and the binary parity check matrix HM1, respectively. A binary cyclic permutation matrix and a non-binary cyclic permutation matrix corresponding to each other may have the same size as each other.

The binary parity check matrix HM1 may be a QC-LDPC code binary parity check matrix. That is, each of the binary cyclic permutation matrices of the binary parity check matrix HM1 may be composed of 1's and 0's.

The parity check matrix generator 10 may generate the non-binary cyclic permutation matrix by placing non-binary elements at the locations of 1's in the corresponding binary cyclic permutation matrix. The parity check matrix generator 10 may generate the non-binary elements by applying a weight as an exponent to a predetermined non-binary value.

The parity check matrix generator 10 may include a first memory 101, a second memory 102, a third memory 103 and a matrix generator 104.

The first memory 101 may store a first weight. The first weight may indicate location information of a non-binary cyclic permutation matrix within the non-binary parity check matrix HM2. Since the non-binary cyclic permutation matrix is located at the same location as the corresponding binary cyclic permutation matrix as described above, the location information of a non-binary cyclic permutation matrix within the non-binary parity check matrix HM2 may be the same as the location information of the corresponding binary cyclic permutation matrix within the corresponding binary parity check matrix HM1.

The second memory 102 may store a second weight. The second weight may indicate the cyclic strength of matrix elements of the non-binary cyclic permutation matrix. The cyclic strength of the matrix elements of a non-binary cyclic permutation matrix may be the same as the cyclic strength of a corresponding binary cyclic permutation matrix.

The third memory 103 may store a third weight. The third weight may be used to determine the size of non-binary matrix elements among the matrix elements of the non-binary cyclic permutation matrix.

The matrix generator 104 may generate a non-binary cyclic permutation matrix by applying a predetermined non-binary value to matrix elements of 1's among matrix elements of a corresponding binary cyclic permutation matrix and reflecting one or more of the first to third weights into the applied non-binary value. The matrix generator 104 may generate a final weight by performing the four fundamental arithmetic operations on one or more of the first to third weights, and reflect the final weight into the non-binary value. The final weight may depend on weights selected among the first to third weights and arithmetic operations used to reflect the selected weights to the applied non-binary value among the four fundamental arithmetic operations.

In this way, the matrix generator 104 may generate the respective non-binary cyclic permutation matrices thereby generating the non-binary parity check matrix HM2.

Therefore, when an error correction circuit is designed, the parity check matrix generator 10 may generate various non-binary parity check matrices HM2 depending on the selection of the weights and arithmetic operations. An optimal non-binary parity check matrices HM2 may be chosen through a performance test on the various non-binary parity check matrices HM2 and then applied to the error correction circuit.

The matrix generator 104 may calculate final weights corresponding to the binary cyclic permutation matrices of the binary parity check matrix HM1 according to the same weight calculation rule.

The non-binary parity check matrix HM2 in accordance with the present embodiment can provide more enhanced performance than the binary parity check matrix HM1. Furthermore, the non-binary parity check matrix HM2 may be generated by the parity check matrix generator 10, based on the location information and cyclic strength of the binary parity check matrix HM1 and the location information of non-zero matrix elements in the binary parity check matrix HM1. Therefore, an error correction circuit using the non-binary parity check matrix HM2 may store only the location information and cyclic strength of the binary parity check matrix HM1 and the location information of the non-zero matrix elements in the binary parity check matrix HM1. That is, the non-binary parity check matrix HM2 may require a smaller storage capacity than a storage capacity that the existing non-binary parity check matrices have required.

Figure 2:
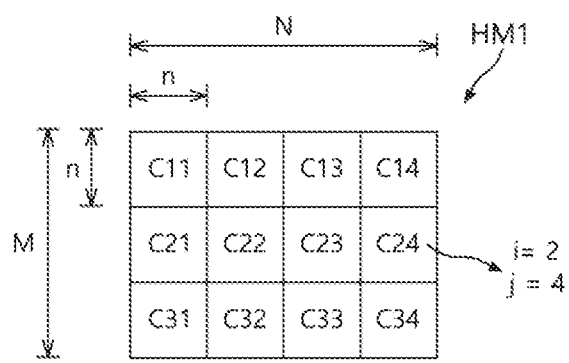
FIG. 2 is a diagram for describing the configuration of a binary parity check matrix.

FIG. 2 is a diagram for describing the configuration of the binary parity check matrix HM1.

Referring to FIG. 2, the binary parity check matrix HM1 may include binary cyclic permutation matrices C11 to C34. The number of the binary cyclic permutation matrices C11 to C34 included in the binary parity check matrix HM1 is only an example. The binary cyclic permutation matrices C11 to C34 may be square matrices having the same size. Each of the binary cyclic permutation matrices C11 to C34 may have 'n' rows and 'n' columns. When the binary parity check matrix HM1 has 'M' rows and 'N' columns as a whole, the binary parity check matrix HM1 may have 'M/n' row sections and 'N/n' column sections. Each of the row sections may correspond to a row composed of 'N/n' binary cyclic permutation matrices. Each of the column sections may correspond to a column composed of 'M/n' binary cyclic permutation matrices.

At some of the locations of the binary cyclic permutation matrices C11 to C34, zero matrices may be arranged. The zero matrices are not targets of the conversion into non-binary cyclic permutation matrices in accordance with the present embodiment. Therefore, the zero matrices within the binary parity check matrix HM1 may keep their locations even within the non-binary parity check matrix HM2. The following descriptions will be based on the supposition that the binary cyclic permutation matrices C11 to C34 are not zero matrices, for convenience of description.

Each of the binary cyclic permutation matrices C11 to C34 may be specified by the corresponding location information, that is, a row value 'i' and a column value 'j'. The row value 'i' of a certain binary cyclic permutation matrix may indicate the order of the row section including the certain binary cyclic permutation matrix within the binary parity check matrix HM1. For example, the row value 'i' may be a natural number which is equal to or more than 1 and equal to or less than 'M/n'. Furthermore, the column value 'j' of the certain binary cyclic permutation matrix may indicate the order of the column section including the certain binary cyclic permutation matrix within the binary parity check matrix HM1. For example, the column value 'j' may be a natural number which is equal to or more than 1 and equal to or less than 'N/n'.

For example, the row value 'i' and the column value 'j' of the binary cyclic permutation matrix C24 may be 2 and 4, respectively.

FIG. 3 is a diagram for describing the configurations of binary cyclic permutation matrices within the binary parity check matrix HM1. Each of the binary cyclic permutation matrices Ci, Ci1 and Ci2 illustrated in FIG. 3 may have a size of 3×3. However, the size is only an example, and the binary cyclic permutation matrices may have various sizes depending on design. The following descriptions will be based on the supposition that the binary cyclic permutation matrices have a size of 3×3.

The binary cyclic permutation matrix Ci may be an identity matrix. Therefore, the cyclic strength 'k' of the binary cyclic permutation matrix Ci may be set to 0.

The binary cyclic permutation matrix Ci1 may be generated by cyclically shifting the binary cyclic permutation matrix Ci to the right by 1. Therefore, the cyclic strength 'k' of the binary cyclic permutation matrix Ci1 may be set to 1.

The binary cyclic permutation matrix Ci2 may be generated by cyclically shifting the binary cyclic permutation matrix Ci to the right by 2. Therefore, the cyclic strength 'k' of the binary cyclic permutation matrix Ci2 may be set to 2.

That is, when a certain binary cyclic permutation matrix is generated by cyclically shifting the identity matrix Ci to the right by an amount of 'k', the amount of 'k' may be defined as the cyclic strength 'k' of the certain binary cyclic permutation matrix.

Referring back to FIG. 2, the binary cyclic permutation matrices C11 to C34 of the binary parity check matrix HM1 may have different cyclic strengths.

As a result, each of the binary cyclic permutation matrices C11 to C34 may have intrinsic matrix characteristics including the first to third weights, for example, the location information and the cyclic strength. Therefore, although the error correction circuit stores the intrinsic matrix characteristics of the binary cyclic permutation matrices C11 to C34 instead of the binary cyclic permutation matrices C11 to C34 themselves when storing the binary parity check matrix HM1, the binary parity check matrix HM1 can be recovered. The binary parity check matrix HM1 may be recovered by placing matrix elements of 1's at locations specified by the intrinsic matrix characteristics of the binary cyclic permutation matrices C11 to C34. Therefore, the binary parity check matrix HM1 may require only a very small storage capacity.

The existing non-binary parity check matrices may require a very large storage capacity because they need to store the values of all elements. However, the non-binary parity check matrix HM2 generated in accordance with the present embodiment may not require to store all of the values of the elements. That is, since the non-binary parity check matrix HM2 is generated based on the matrix characteristics of the binary parity check matrix HM1, the non-binary parity check matrix HM2 may be recovered from the intrinsic matrix characteristics of the binary cyclic permutation matrices of the binary parity check matrix HM1 by the error correction circuit. Therefore, the non-binary parity check matrix HM2 may require only a small storage capacity, and exhibit more enhanced performance.

FIG. 4 illustrates non-binary cyclic permutation matrices C21 to C27 which are generated through various selection of the weights and arithmetic operations (referred to as "weight calculation rules" in FIG. 4) in accordance with the present embodiment. FIG. 4 illustrates a process of generating a non-binary cyclic permutation matrix C2 by calculating the final weight corresponding to a binary cyclic permutation matrix C1 through the selection of the weights and arithmetic operations and applying the final weight to a non-binary value 'a'.

FIG. 4 illustrates the binary cyclic permutation matrix C1 of which the cyclic strength 'k' among the matrix characteristics is 1, for example. The binary cyclic permutation matrix C1 may also have a row value 'i' and a column value 'j'. The binary cyclic permutation matrix C1 may be converted into the non-binary cyclic permutation matrices C21 to C27 according to the various selection of the weights and arithmetic operations.

The non-binary cyclic permutation matrix C2 generated within the non-binary parity check matrix HM2 in such a manner may be located at the same row section and column section as the binary cyclic permutation matrix C1 within the binary parity check matrix HM1. That is, the non-binary cyclic permutation matrix C2 may be generated on the basis of the binary cyclic permutation matrix C1 located at the $i^{th}$ row section and the $j^{th}$ column section in the binary parity check matrix HM, and may be located at the $i^{th}$ row section and the $j^{th}$ column section in the non-binary parity check matrix HM2.

Hereafter, the method for converting the binary cyclic permutation matrix C1 into the non-binary cyclic permutation matrix C2 will be described in detail as follows.

In the non-binary cyclic permutation matrix C2, to which the final weight is to be applied may be a predetermined non-binary value 'a'. According to any selection of the weights and arithmetic operations, the non-binary value 'a' may be located, within the non-binary cyclic permutation matrix C2, at the same locations as 1's within the binary cyclic permutation matrix C1. That is, the location of 'a' may be determined according to the cyclic strength of 1 of the binary cyclic permutation matrix C1. Then, the calculated final weight (e.g., having a value of 'i', 'j' or 'k' as illustrated in the non-binary cyclic permutation matrix C21, C22 or C23 in FIG. 4) may be applied as an exponent to 'a'.

The final weight may be calculated by applying addition to one or more of the row value 'i', the column value 'j' and the cyclic strength 'k' of the binary cyclic permutation matrix C1. For example, the weight 'i+j' of the non-binary cyclic permutation matrix C24 may be calculated by adding the row value 'i' and the column value j. When only one variable is selected among the row value 'i', the column value 'j' and the cyclic strength 'k' of the binary cyclic permutation matrix C1 for the generation of the final weights of the non-binary cyclic permutation matrices C21 to C23, addition may not be actually performed.

The weight calculation rule of FIG. 4 uses only addition, for example. In an embodiment, however, other arithmetic operations, i.e., subtraction, multiplication and division may also be used. Furthermore, the final weight may be calculated through selection of not only one kind of arithmetic operation but a combination of two or more arithmetic operations.

The selection of the weights and arithmetic operations may depend on a target performance of the non-binary parity check matrix HM2. The non-binary parity check matrices HM2 having the target performance may be chosen through a performance test on the various non-binary parity check matrices HM2 generated according to the various selection of the weights and arithmetic operations and then applied to the error correction circuit.

Figures 5, 6:
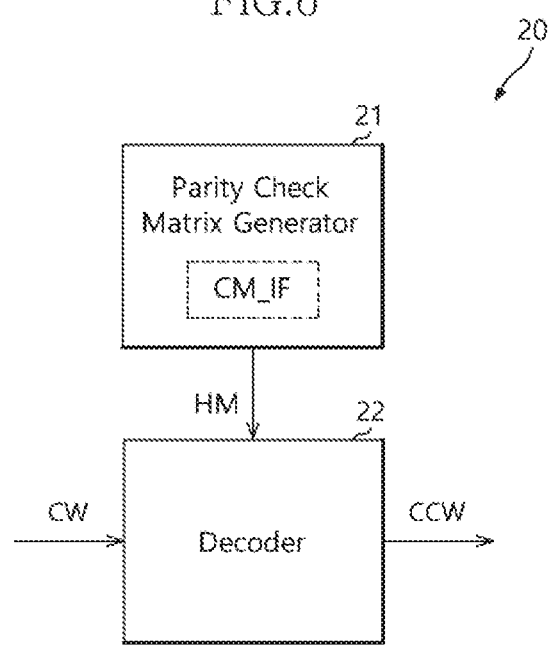
FIG. 5 illustrates a method for generating a non-binary cyclic permutation matrix through a weight calculation rule which further considers a third weight, in accordance with the present embodiment.
FIG. 6 is a block diagram illustrating an error correction circuit according to an embodiment.

FIG. 5 illustrates a method for generating a non-binary cyclic permutation matrix C3 through the selection of the weights further including the third weight, in accordance with an embodiment.

Referring to FIG. 5, the non-binary cyclic permutation matrix C3 may be converted from the binary cyclic permutation matrix C1. As described with reference to FIG. 4, the non-binary cyclic permutation matrix C3 may be generated by applying the final weight to the non-binary value 'a'. The final weight of the non-binary cyclic permutation matrix C3 may be calculated by further considering the third weight to the first weight (i.e., the row value 'i' and the column value 'j') of the binary cyclic permutation matrix C1, for example.

The elements of the non-binary cyclic permutation matrix C3 may correspond to the third weights of 0, 1, and 2. The third weights may be applied to the respective rows of the non-binary cyclic permutation matrix C3, while sequentially increasing from 0. The third weights may be used to determine the sizes of the non-binary matrix elements among the matrix elements of the non-binary cyclic permutation matrix C3. When the third weights are further applied to the intrinsic matrix characteristics of the binary cyclic permutation matrix C1, the final weights of the non-binary cyclic permutation matrix C3 may be different for the respective rows. The third weights may correspond to circulation weights (i.e., may also be referred to as cyclic weights).

The weight calculation rule of FIG. 5 uses only addition, for example. In an embodiment, however, other arithmetic operations, i.e., subtraction, multiplication and division may also be used. Furthermore, the final weight may be calculated through selection of not only one kind of arithmetic operation but a combination of two or more arithmetic operations.

The weight calculation rule of FIG. 5 uses only the row value 'i' and the column value 'j' as variables among the intrinsic matrix characteristics of the binary cyclic permutation matrix C1. As described with reference to FIG. 4, however, various combinations of variables may be used.

In short, the weights of the non-binary cyclic permutation matrices C2 and C3 of FIGS. 4 and 5 can be calculated through the selection of the weights and arithmetic operations, when the intrinsic matrix characteristics of the binary cyclic permutation matrix C1 are known. Furthermore, the elements of the non-binary cyclic permutation matrices C2 and C3 may be generated by applying the selected weights and arithmetic operations to a predetermined non-binary value. Therefore, a storage capacity for the non-binary cyclic permutation matrices C2 and C3 may not be actually increased in comparison to the storage capacity for storing the binary cyclic permutation matrix.

FIG. 6 is a block diagram illustrating an error correction circuit 20 in accordance with an embodiment.

The error correction circuit 20 may include a parity check matrix generator 21 and a decoder 22.

The parity check matrix generator 21 may generate a QC-LDPC code parity check matrix HM. The parity check matrix HM may correspond to the non-binary parity check matrix HM2 which is generated according to the method described with reference to FIGS. 1 to 5. The parity check matrix generator 21 may be configured in a substantially similar manner to the parity check matrix generator 10 of FIG. 1. The parity check matrix generator 21 may generate the parity check matrix HM in a substantially similar manner to the method in which the parity check matrix generator 10 of FIG. 1 generates the non-binary parity check matrix HM2, and provide the generated parity check matrix HM to the decoder 22. That is, the parity check matrix generator 21 may generate the parity check matrix HM by selecting and applying the weights and arithmetic operations to predetermined characteristics CM_IF (e.g., the intrinsic matrix characteristics of the binary cyclic permutation matrices within the binary parity check matrix HM1). The characteristics CM_IF may be related to a binary parity check matrix (e.g., the binary parity check matrix HM1) which is the basis for generating the parity check matrix HM (e.g., the non-binary parity check matrix HM2) through the parity check matrix generator 10. That is, the characteristics CM_IF may include the first to third weights of the binary cyclic permutation matrices of the binary parity check matrix HM1.

An optimal parity check matrices HM may be chosen through a performance test on the various parity check matrices generated through the various selection of the weights and arithmetic operations and then applied to the parity check matrix generator 10.

The decoder 22 may perform a decoding operation on a codeword CW based on the parity check matrix HM, and output the corrected codeword CCW.

Figure 7:
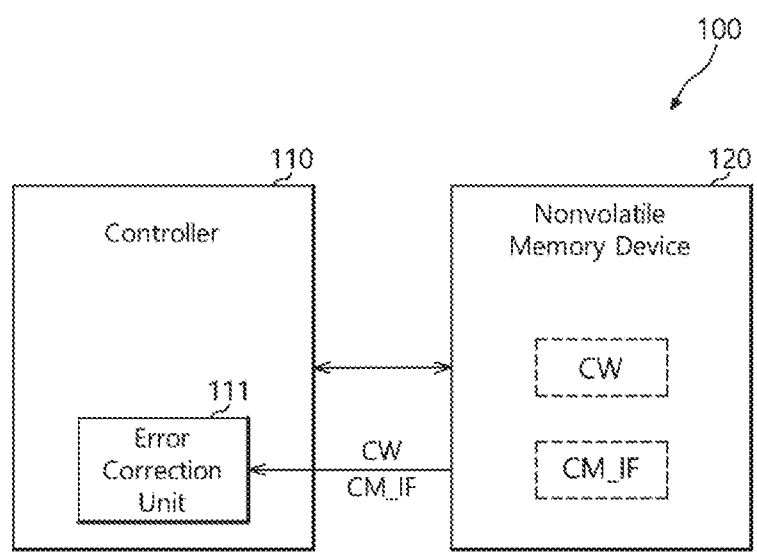
FIG. 7 is a block diagram illustrating a memory system in accordance with an embodiment.

FIG. 7 is a block diagram illustrating a memory system 100 in accordance with an embodiment.

The memory system 100 may be configured to store data provided from an external device in response to a write request of the external device. Furthermore, the memory system 100 may be configured to provide data stored therein to the external device in response to a read request of the external device.

The memory system 100 may be configured as a Personal Computer Memory Card International Association (PCM-CIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

The memory system 100 may include a controller 110 and a nonvolatile memory device 120.

The controller 110 may control overall operations of the memory system 100. The controller 110 may store data in the nonvolatile memory device 120 in response to a write request transferred from the external device, and read data stored in the nonvolatile memory device 120 and output the read data to the external device in response to a read request transferred from the external device.

The controller 110 may include an error correction unit 111. The error correction unit 111 may perform a decoding operation on a codeword CW read from the nonvolatile memory device 120 based on a QC-LDCP code parity check matrix. The error correction unit 111 may be configured and operated in substantially the same manner as the error correction circuit 20 illustrated in FIG. 7. The error correction unit 111 may load characteristics CM_IF stored in the nonvolatile memory device 120 at the beginning of operation, for example, store the characteristics CM_IF in a parity check matrix generator (not illustrated) therein, and use the characteristics CM_IF to generate the parity check matrix.

The nonvolatile memory device 120 may store data transferred from the controller 110, or read data stored therein and transfer the read data to the controller 110, according to control of the controller 110. The nonvolatile memory device 120 may store the characteristics CM_IF and the codeword CW.

The nonvolatile memory device 120 may include a flash memory, such as a NAND flash or a NOR flash, a Ferro-electrics Random Access Memory (FeRAM), a Phase-Change Random Access Memory (PCRAM), a Magnetore-sistive Random Access Memory (MRAM), a Resistive Random Access Memory (ReRAM), and the like.

FIG. 7 illustrates that the memory system 100 includes one nonvolatile memory device 120, but the number of nonvolatile memory devices included in the memory system 100 is not limited thereto.

The parity check matrix device for generating a QC-LDPC code parity check matrix and the operating method thereof in accordance with the present embodiment can generate a parity check matrix which requires a small storage capacity while providing enhanced performance.

The error correction circuit in accordance with the present embodiment may require a small storage capacity for a parity check matrix, while operating with the enhanced performance.

While various embodiments have been described above, it will be understood to those skilled in the art that the embodiments described are examples only. Accordingly, the parity check matrix device, the operating method thereof and the error correction circuit, which are described herein, should not be limited based on the described embodiments.

What is claimed is:

1. A parity check matrix generator for generating a parity check matrix of a Quasi Cyclic Low Density Parity Check (QC-LDPC) code, the parity check matrix including non-binary cyclic permutation matrices, comprising:
a first memory configured to store a first weight as location information on a non-binary cyclic permutation matrix within the parity check matrix;
a second memory configured to store a second weight as cyclic strength of matrix elements of the non-binary cyclic permutation matrix;
a third memory configured to store a third weight used to determine a size of a non-binary matrix element among the matrix elements of the non-binary cyclic permutation matrix; and
a matrix generator configured to generate the non-binary cyclic permutation matrix by applying a non-binary value to matrix elements of 1's among matrix elements of a binary cyclic permutation matrix having a size corresponding to the non-binary cyclic permutation matrix and reflecting one or more of the first to third weights into the non-binary value.

2. The parity check matrix generator according to claim 1, wherein the matrix generator performs an arithmetic operation on the one or more of the first to third weights, and applies a value obtained by the arithmetic operation as an exponent to the non-binary value.

3. The parity check matrix generator according to claim 1, wherein the matrix elements of the non-binary cyclic permutation matrix are located in the non-binary cyclic permutation matrix based on the cyclic strength.

4. The parity check matrix generator according to claim 1, wherein a location of the non-binary cyclic permutation matrix within the parity check matrix is the same as a location of the binary cyclic permutation matrix within a binary parity check matrix.

5. An operating method of a parity check matrix generator for generating a parity check matrix of a Quasi Cyclic Low Density Parity Check (QC-LDPC) code, the operating method comprising generating a non-binary parity check matrix including non-binary cyclic permutation matrices by converting binary cyclic permutation matrices included in a binary parity check matrix into the non-binary cyclic permutation matrices, respectively,
wherein the converting of the binary cyclic permutation matrices into the non-binary cyclic permutation matrices comprises:

calculating a weight corresponding to a binary cyclic permutation matrix based on matrix characteristics of the binary cyclic permutation matrix; and generating elements of a non-binary cyclic permutation matrix by applying the weight to a non-binary value.

6. The operating method according to claim 5, wherein the weight is calculated based on one or more of a row value, a column value, and cyclic strength which are included in the matrix characteristics.

7. The operating method according to claim 5, wherein the weight is calculated based on a circulation weight and one or more of a row value, a column value, and cyclic strength which are included in the matrix characteristics.

8. The operating method according to claim 5, wherein the binary cyclic permutation matrices respectively correspond to weights calculated through a same weight calculation rule.

9. The operating method according to claim 5, wherein the weight is applied to the non-binary value as an exponent.

10. The operating method according to claim 5, wherein the generating of the non-binary parity check matrix includes placing the elements based on cyclic strength included in the matrix characteristics.

11. The operating method according to claim 5, wherein the generating of the non-binary parity check matrix includes placing, within the parity check matrix, the non-binary cyclic permutation matrix at a same location as the binary cyclic permutation matrix within the binary parity check matrix.

12. An error correction circuit comprising:
a parity check matrix generator configured to generate a parity check matrix of a Quasi Cyclic Low Density Parity Check (QC-LDPC); and
a decoder configured to perform a decoding operation on a codeword based on the parity check matrix, wherein the parity check matrix generator:
stores matrix characteristics of binary cyclic permutation matrices included in a binary parity check matrix of the QC-LDPC code,
generates non-binary cyclic permutation matrices based on the matrix characteristics, and
provides the parity check matrix including the non-binary cyclic permutation matrices to the decoder.

13. The error correction circuit according to claim 12, wherein the parity check matrix generator generates elements of a non-binary cyclic permutation matrix by calculating a weight corresponding to a binary cyclic permutation matrix based on the matrix characteristics of the binary cyclic permutation matrix, and applying the weight to a non-binary value.

14. The error correction circuit according to claim 13, wherein the parity check matrix generator calculates the weight based on one or more of a row value, a column value, and cyclic strength which are included in the matrix characteristics.

15. The error correction circuit according to claim 13, wherein the parity check matrix generator calculates the weight based on a circulation weight and one or more of a row value, a column value, and cyclic strength which are included in the matrix characteristics.

16. The error correction circuit according to claim 13, wherein the parity check matrix generator places the elements based on cyclic strength included in the matrix characteristics.

17. The error correction circuit according to claim 12, wherein the parity check matrix generator places, within the parity check matrix, the non-binary cyclic permutation matrices at the same locations as the binary cyclic permutation matrices within the binary parity check matrix.

* * * * *